US010181818B2

(12) United States Patent
Lin et al.

(10) Patent No.: US 10,181,818 B2
(45) Date of Patent: Jan. 15, 2019

(54) LOW-NOISE AMPLIFIER, FOLDED LOW-NOISE AMPLIFIER AND AMPLIFIER CIRCUIT MODULE

(71) Applicant: Airoha Technology Corp., Hsinchu (TW)

(72) Inventors: Heng-Chih Lin, Hsinchu (TW); Chien-Kuang Lee, Jhubei (TW); Yao-Te Chiu, Zhubei (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 15/202,635

(22) Filed: Jul. 6, 2016

(65) Prior Publication Data

US 2017/0170788 A1     Jun. 15, 2017

Related U.S. Application Data

(60) Provisional application No. 62/267,257, filed on Dec. 14, 2015.

(30) Foreign Application Priority Data

Mar. 21, 2016   (TW) .............................. 105108690 A (51) Int. Cl.
*H03F 3/04*       (2006.01)
*H03F 1/02*       (2006.01)
(Continued)

(52) U.S. Cl.
CPC ........... *H03F 1/0205* (2013.01); *H03F 1/223* (2013.01); *H03F 1/26* (2013.01); *H03F 1/565* (2013.01);
(Continued)

(58) Field of Classification Search
CPC ........................................................ H03F 3/04
(Continued)

(56) References Cited

U.S. PATENT DOCUMENTS 3,886,458 A *  5/1975  Matsumoto ......... H01L 27/0658
                                                                257/535
5,838,200 A *  11/1998 Opris .................. H03F 3/45188
                                                                330/253
(Continued)

OTHER PUBLICATIONS

El-Gamal, et al.: "Wireless Communication Circuits and Systems (Circuits, Devices and Systems)"; Chapter 7: Low-Voltage Integrated RF CMOS Modules and Frontend for 5 GHz and Beyond; Dec. 19, 2003; http://flylib.com/books/en/3.253.1.47/1/.

(Continued)

*Primary Examiner* — Henry Choe
(74) *Attorney, Agent, or Firm* — McClure, Qualey & Rodack, LLP (57) ABSTRACT

A low-noise amplifier (LNA), a folded low-noise amplifier (folded LNA) and an amplifier circuit module are provided. The LNA includes a plurality of radio frequency (RF) input stages, at least one bias transistor and at least one radio frequency (RF) output stage. The bias transistor is connected to the RF input stages to provide a DC bias source to one of the RF input stages for isolating others of the RF input stages. The RF output stage is connected in parallel with the RF input stages, which share an adjustable input inductor.

4 Claims, 7 Drawing Sheets

(51) Int. Cl.
*H03F 1/56* (2006.01)
*H03F 3/19* (2006.01)
*H03F 1/22* (2006.01)
*H03F 1/26* (2006.01)
*H03F 3/193* (2006.01)
*H03F 3/72* (2006.01)

(52) U.S. Cl.
CPC ............... *H03F 3/19* (2013.01); *H03F 3/193* (2013.01); *H03F 3/72* (2013.01); *H03F 2200/111* (2013.01); *H03F 2200/216* (2013.01); *H03F 2200/294* (2013.01); *H03F 2200/372* (2013.01); *H03F 2200/451* (2013.01); *H03F 2200/492* (2013.01); *H03F 2203/7209* (2013.01)

(58) Field of Classification Search
USPC .................................................. 330/296, 285
See application file for complete search history.

(56) References Cited

U.S. PATENT DOCUMENTS

| | | | | |
|---|---|---|---|---|
| 7,023,272 B2* | 4/2006 | Hung | ..................... | H03F 1/223 330/126 |
| 7,345,534 B2* | 3/2008 | Grebennikov | ........ | H03F 1/0277 330/124 R |
| 7,616,061 B2* | 11/2009 | Cha | ......................... | H03F 1/223 330/126 |
| 8,319,555 B1* | 11/2012 | Heikkinen | .............. | H03F 1/565 330/283 |
| 9,154,087 B2* | 10/2015 | Jin | .......................... | H03F 1/565 |
| 9,385,658 B2* | 7/2016 | Zhang | ................... | H03F 1/0205 |
| 9,590,741 B2* | 3/2017 | Parikh | ................ | H04L 25/03885 |
| 2001/0045867 A1* | 11/2001 | Miyashita | ............. | H03F 1/0261 330/302 |
| 2007/0285175 A1* | 12/2007 | Oh | .......................... | H03F 1/223 330/311 |
| 2007/0296507 A1* | 12/2007 | Hamaguchi | ........... | H03F 1/0205 330/311 |
| 2010/0271122 A1* | 10/2010 | Masuda | ............... | H03G 3/3052 330/144 |
| 2014/0085009 A1 | 3/2014 | Chung et al. | | |

OTHER PUBLICATIONS

Lavasani, S. H. M., Chaudhuri, B. and Kiaei, S., "A pseudo-concurrent 0.18 um multi-band CMOS LNA," IEEE MTT-S International Microwave Symposium Digest, v.1, pp. A181-A184, Jun. 2003. (Only Abstract provided—full text available in file history of U.S. Pat. No. 7,023,272).

TIPO Office Action dated Dec. 26, 2016 in Taiwan application (No. 105108690).

"Design of Analog CMOS Integrated Circuits," McGraw-Hill, pp. 90-92, 2001.

* cited by examiner

LOW-NOISE AMPLIFIER, FOLDED LOW-NOISE AMPLIFIER AND AMPLIFIER CIRCUIT MODULE

This application claims the benefits of U.S. provisional application Ser. No. 62/267,257, filed Dec. 14, 2015, and Taiwan application Serial No. 105108690, filed Mar. 21, 2016, the disclosure of which are incorporated by reference herein in its entirety.

TECHNICAL FIELD

The disclosure relates in general to an amplifier and a circuit module, and more particularly to a low-noise amplifier (LNA), a folded LNA and an amplifier circuit module.

BACKGROUND

Figure 1:
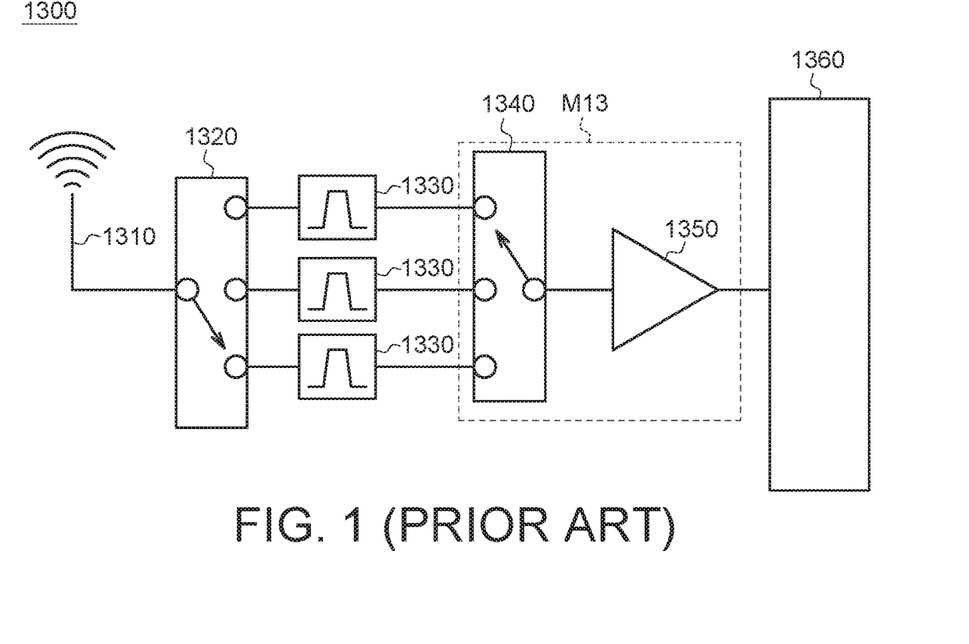
FIG. 1 shows a schematic diagram of a conventional multi-band antenna device.

Along with the development of the antenna technology, a multi-band antenna device is provided. Referring to FIG. 1, a schematic diagram of a conventional multi-band antenna device 1300 is shown. The multi-band antenna device 1300 includes an antenna 1310, a switch 1320, a plurality of filter 1330, a switch 1340, a low-noise amplifier (LNA) 1350 and a transceiver 1360.

In an amplifier circuit module M13 composed of the switch 1340 and the LNA 1350, the efficiency of the multi-band antenna device 1300 is affected by noise figure. The lower the noise figure is, the higher the efficiency of the multi-band antenna device 1300 is. Researchers are now working on how to effectively bring down the noise figure of the amplifier circuit module M13.

SUMMARY

The invention is directed to a low-noise amplifier (LNA), a folded LNA and an amplifier circuit module. A switch function is implemented through a bias transistor in the LNA (or the folded LNA). Or a switch is disposed following the LNA (or the folded LNA). As such, the noise figure of the LNA (or the folded LNA) can be easier to control.

According to one embodiment of the invention, a low-noise amplifier (LNA) is provided. The LNA includes a plurality of radio frequency (RF) input stages, at least one bias transistor and at least one radio frequency (RF) output stage. The bias transistor is connected to the RF input stages to provide a DC bias source to one of the RF input stages for isolating others of the RF input stages. The RF output stage is connected in parallel with the RF input stages, which share an adjustable input inductor.

According to another embodiment of the invention, a folded low-noise amplifier (folded LNA) is provided. The folded LNA includes a plurality of RF input stages, at least one bias transistor and an RF output stage. The bias transistor is connected to the RF input stages to provide a DC bias source to one of the RF input stages for isolating others of the RF input stages. The RF output stage is connected in parallel with the RF input stages. A quantity of the RF output stage is one. The RF output stage includes an adjustable output inductor. The RF input stages share the adjustable output inductor.

According to an alternate embodiment of the invention, an amplifier circuit module is provided. The amplifier circuit module includes a plurality of low-noise amplifiers (LNAs) and a switch. Each of the LNAs includes a radio frequency (RF) output stage. The switch is coupled to the RF output stages for switching the LNAs.

The above and other aspects of the disclosure will become better understood with regard to the following detailed description of the preferred but non-limiting embodiment(s). The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
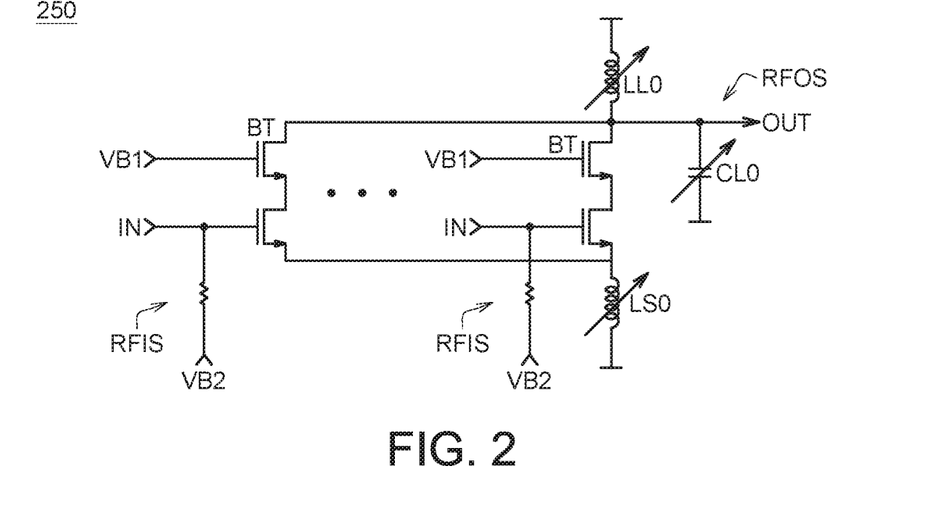
FIG. 2 shows a schematic diagram of a low-noise amplifier (LNA) according to an embodiment.

Referring to FIG. 2, a schematic diagram of a low-noise amplifier (LNA) 250 according to an embodiment is shown. The LNA 250 includes a plurality of radio frequency (RF) input stages RFIS, a plurality of bias transistors BT and a radio frequency (RF) output stage RFOS. Each bias transistor BT can be realized by an N-type metal-oxide-semiconductor field-effect transistor (MOSFET). The RF output stage RFOS is connected in parallel with the RF input stages RFIS.

A plurality of RF input stages RFIS receive a plurality of RF signals of different bands from a plurality of input ends IN respectively. The bias transistors BT are connected to the RF input stages RFIS to provide a DC bias source VB1 to one of the RF input stages RFIS for isolating others of the RF input stages RFIS. Besides, each of the input ends IN is also connected to a DC bias source VB2. Only the RF input stage RFIS receiving the DC bias source VB1 and the DC bias source VB2 can transmit the RF signals to an output end OUT, and the others of the RF input stages RFIS not receiving the DC bias source VB1 and the DC bias source VB2 are isolated and cannot transmit the RF signals to the output end OUT.

Thus, a switch function is implemented through the bias transistors BT in the LNA 250, such that the LNA 250 can be operated under multi bands without using any external switch. Once the external switch is omitted, the LNA 250 is the only one element in the link, and the noise figure will be easier to control.

For example, based the Friis noise figure formula, the noise figure of two elements is calculated according to formula (1), wherein $F_{total}$ represents a total noise figure, $F_1$ represents a noise figure of the first stage element, $G_1$ represents a gain of the first stage element, $F_2$ represents a noise figure of the second stage element, and $G_2$ represents a gain of the second stage element. Formula (1) shows that when the switch and the LNA are connected in series, the noise figure of the LNA which is the second stage element cannot be too high. Otherwise, the total noise figure will be too high.

$$F_{total} = F_1 + \frac{F_2 - 1}{G_1} \qquad (1)$$

Likewise, based the Friis noise figure formula, the noise figure of the only one element is calculated according to formula (2), wherein $F_{total}$ represents a total noise figure, and $F_1$ represents a noise figure of the first stage element. Formula (2) shows that when the LNA is the only one element, the noise figure of the LNA is the total noise figure, and the noise figure of the LNA will be easier to control.

$$F_{total} = F_1 \qquad (2)$$

In the present embodiment, the RF input stages RFIS share an adjustable input inductor LS0. The adjustable input inductor LS0 can be adjusted to a specific inductance value according to the target RF input stage RFIS.

Moreover, in the present embodiment, the quantity of the RF output stage RFOS is one. The RF output stage RFOS includes an adjustable output inductor LL0 and an adjustable output capacitance CL0. The adjustable output inductor LL0 is connected to the bias transistors BT. The adjustable output capacitance CL0 is connected to the output end OUT. The RF input stages RFIS share the only one adjustable output inductor LL0 and the only one adjustable output capacitance CL0. That is, in the present embodiment, the design of multiple RF input stages RFIS corresponding to one RF output stage RFOS is implemented through the shared adjustable output inductor LL0 and the shared adjustable output capacitance CL0.

Figure 3:
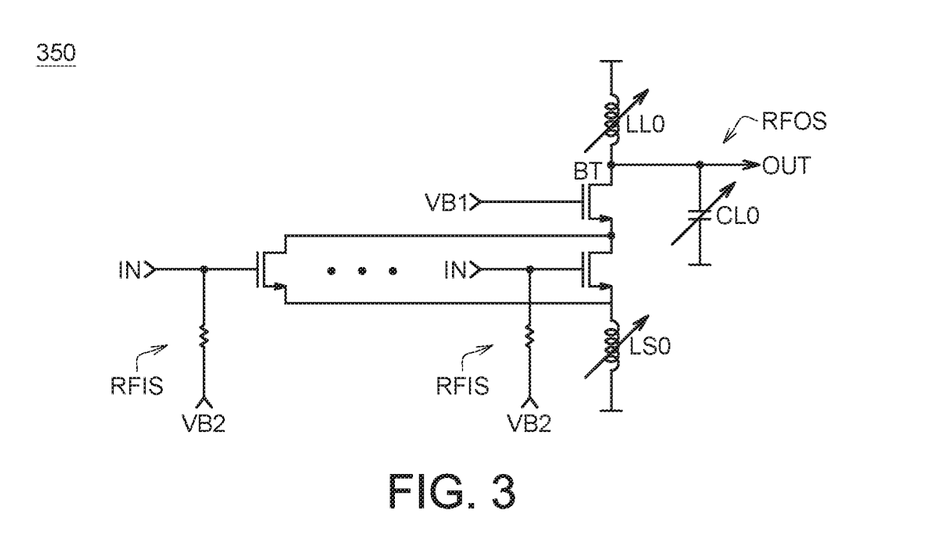
FIG. 3 shows a schematic diagram of an LNA according to another embodiment.

Referring to FIG. 3, a schematic diagram of an LNA 350 according to another embodiment is shown. The embodiment of FIG. 3 is different from the embodiment of FIG. 2 mainly in that the quantity of the bias transistor BT is one, and the similarities are not repeated here. The RF input stages RFIS share the only one bias transistor BT. Since the bias transistor BT is shared by all RF input stages RFIS, the bias transistor BT continues to provide a DC bias source VB1. Only the RF input stage RFIS receiving the DC bias source VB2 can transmit the RF signals to the output end OUT, and the others of the RF input stages RFIS not receiving the DC bias source VB2 are isolated and cannot transmit the RF signals to the output end OUT.

Although the only one bias transistor BT is shared, a switch function still can be implemented in the LNA 250 through the control of the DC bias source VB2, and the LNA 250 can be operated under multi bands without using any external switch. Once the external switch is omitted, the LNA 250 becomes the only one element in the link, and the noise figure will be easier to control.

Figure 4:
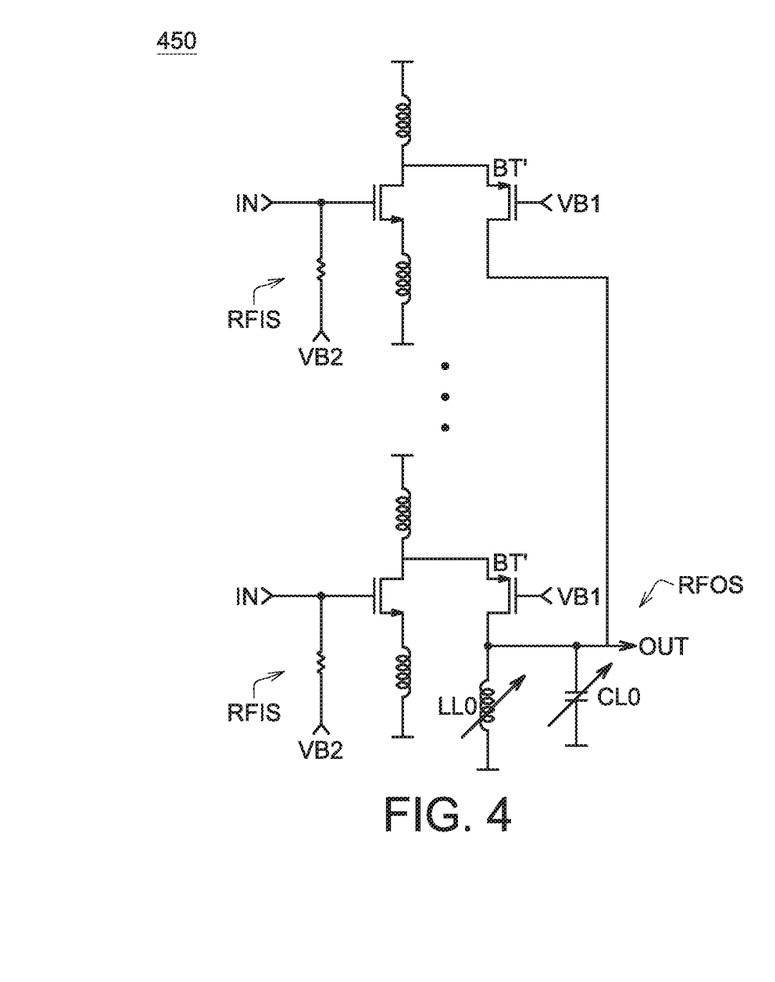
FIG. 4 shows a schematic diagram of a folded low-noise amplifier (folded LNA) according to another embodiment.

Referring to FIG. 4, a schematic diagram of a folded low-noise amplifier (Folded LNA) 450 according to another embodiment is shown. The above function can be implemented by the folded LNA, also. As indicated in FIG. 4, the folded LNA 450 includes a plurality of RF input stages RFIS, a plurality of bias transistors BT' and an RF output stage RFOS. Each bias transistor BT' can be realized by a P-type metal-oxide-semiconductor field-effect transistor (MOSFET). The RF output stage RFOS is connected in parallel with the RF input stages RFIS.

In the present embodiment, a plurality of RF input stages RFIS receive a plurality of RF signals of different bands from a plurality of input ends IN respectively. The bias transistors BT' are connected to the RF input stages RFIS to provide a DC bias source VB1 to one of the RF input stages RFIS for isolating the others of the RF input stages RFIS. Besides, each of the input ends IN is also connected to the DC bias source VB2. Only the RF input stage RFIS receiving the DC bias source VB1 and the DC bias source VB2 can transmit the RF signals to the output end OUT, and the others of the RF input stages RFIS not receiving the DC bias source VB1 and the DC bias source VB2 are isolated and cannot transmit the RF signals to the output end OUT.

Thus, a switch function is implemented through the bias transistors BT' in the folded LNA 450, such that the folded LNA 450 can be operated under multi bands without using any external switch. Once the external switch is omitted, the folded LNA 450 is the only one element in the link, and the noise figure will be easier to control.

Moreover, in the present embodiment, the quantity of the RF output stage RFOS is merely one. The RF output stage RFOS includes an adjustable output inductor LL0 and an adjustable output capacitance CL0. The adjustable output inductor LL0 is connected to the bias transistor BT. The adjustable output capacitance CL0 is connected to the output end OUT. The RF input stages RFIS share the only one adjustable output inductor LL0 and the only one adjustable output capacitance CL0. That is, in the present embodiment, the design of multiple RF input stages RFIS corresponding to one RF output stage RFOS is implemented through the shared adjustable output inductor LL0 and the shared adjustable output capacitance CL0.

Figure 5:
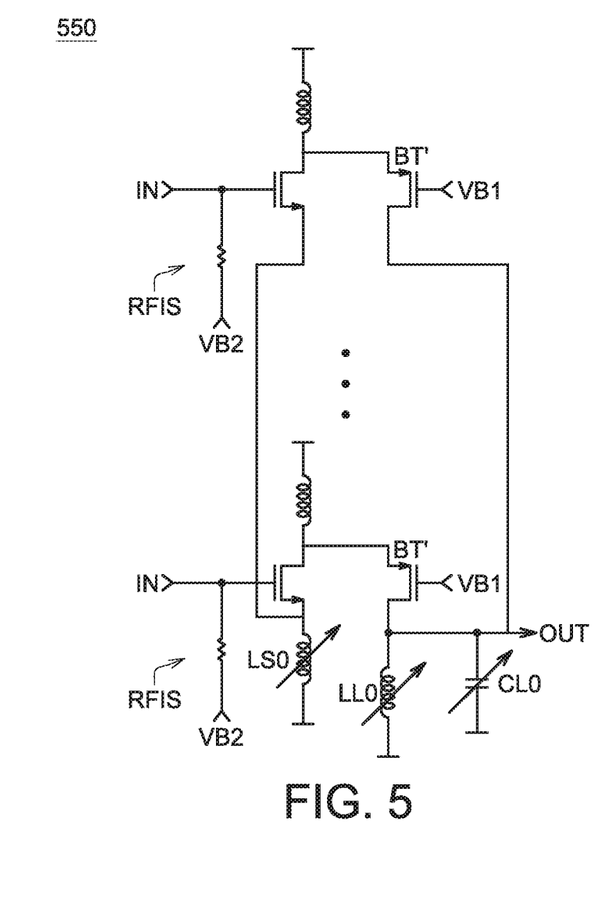
FIG. 5 shows a schematic diagram of an LNA according to another embodiment.

Referring to FIG. 5, a schematic diagram of a folded LNA 550 according to another embodiment is shown. The embodiment of FIG. 5 is different from the embodiment of FIG. 4 mainly in that the RF input stages RFIS share an adjustable input inductor LS0. The adjustable input inductor LS0 can be adjusted to a specific inductance value according to the target RF input stage RFIS. Thus, the quantity of elements can be largely reduced to comply with the market trend of lightweight, slimness and compactness.

Figure 6:
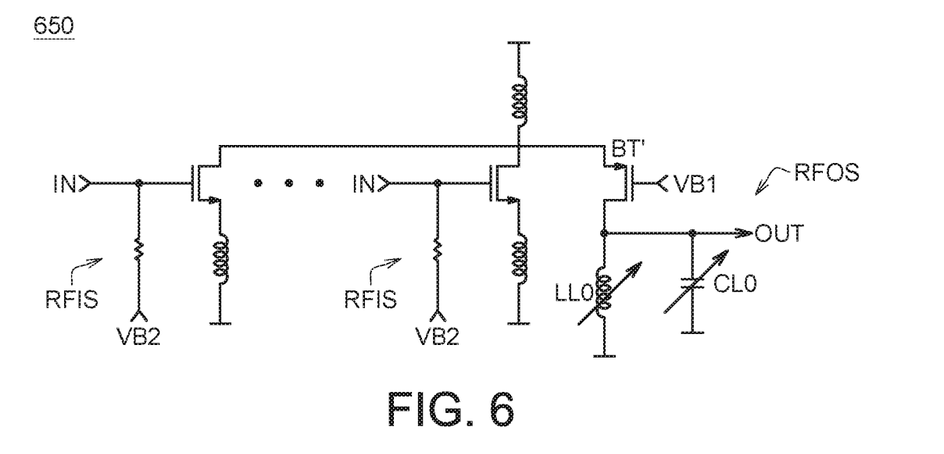
FIG. 6 shows a schematic diagram of an LNA according to another embodiment.

Referring to FIG. 6, a schematic diagram of a folded LNA 650 according to another embodiment is shown. The embodiment of FIG. 6 is different from the embodiment of FIG. 4 mainly in that the quantity of the bias transistor BT' is one, and the similarities are not repeated here. The RF input stages RFIS share the only one bias transistor BT'. Since the bias transistor BT' is shared by all RF input stages RFIS, the bias transistor BT' continues to provide the DC bias source VB1. Only the RF input stage RFIS receiving the DC bias source VB2 can transmit the RF signals to the output end OUT, and the others of the RF input stages RFIS not receiving the DC bias source VB2 are isolated and cannot transmit the RF signals to the output end OUT.

Although the only one bias transistor BT is shared, a switch function still can be implemented in the folded LNA 650 through the control of the DC bias source VB2, and the folded LNA 650 can be operated under multi bands without using any external switch. Once the external switch is omitted, the folded LNA 650 becomes the only one element in the link, and the noise figure will be easier to control.

Figure 7:
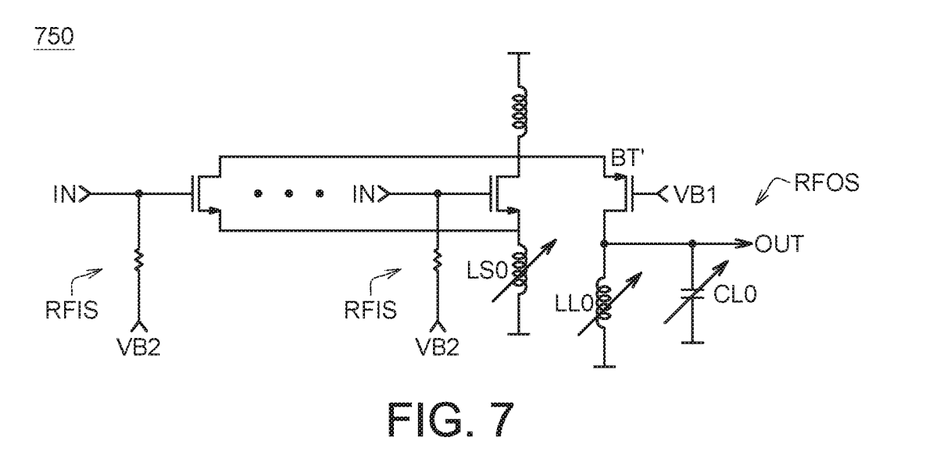
FIG. 7 shows a schematic diagram of an LNA according to another embodiment.

Referring to FIG. 7, a schematic diagram of a folded LNA 750 according to another embodiment is shown. The embodiment of FIG. 7 is different from the embodiment of FIG. 6 mainly in that the RF input stages RFIS share an adjustable input inductor LS0. The adjustable input inductor LS0 can be adjusted to a specific inductance value according to the target RF input stage RFIS. Thus, the quantity of elements can be largely reduced to comply with the market trend of lightweight, slimness and compactness.

Figure 8:
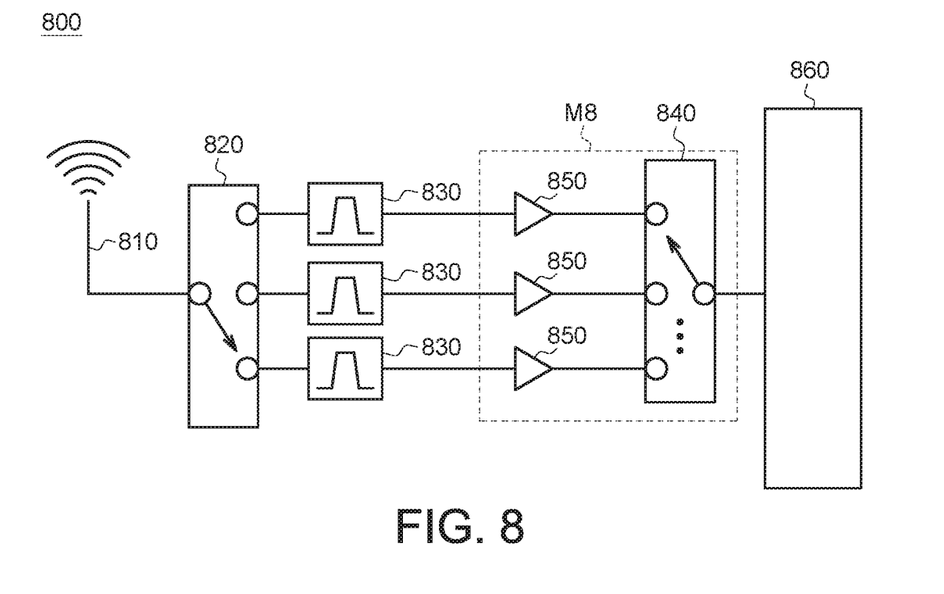
FIG. 8 shows a schematic diagram of a multi-band antenna device according to an embodiment.

Referring to FIG. 8, a schematic diagram of a multi-band antenna device 800 according to an embodiment is shown. The multi-band antenna device 800 includes an antenna 810, a switch 820, a plurality of filters 830, a switch 840, a plurality of low-noise amplifiers (LNA) 850 and a transceiver 860. The switch 840 is coupled to the LNAs 850 for switching the LNAs 850.

In the amplifier circuit module M8 composed of the switch 840 and LNAs 850, each of the LNA 850s is a first stage element, and the switch 840 is a second stage element. According to the formula (1) of the disclosure, the noise figure of the first stage element is easier to control. Therefore, the noise figure of the LNAs each of which is the first stage element will be easier to control.

Figure 9:
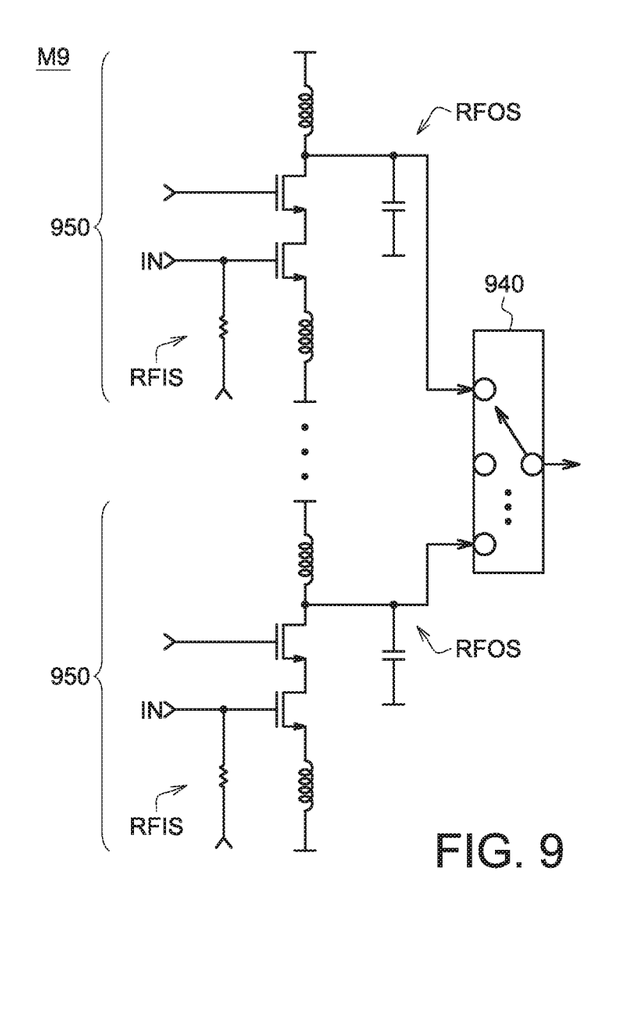
FIG. 9 shows a schematic diagram of an amplifier circuit module according to an embodiment.

Referring to FIG. 9, a schematic diagram of an amplifier circuit module M9 according to an embodiment is shown. The amplifier circuit module M9 includes a plurality of LNAs 950 and a switch 940. Each of the LNAs 950 includes a radio frequency input state RFIS and an RF output stage RFOS. The switch 940 is coupled to the RF output stages RFOS for switching the LNAs 950.

In the present embodiment, a plurality of RF input stages RFIS respectively correspond to a plurality of RF output stages RFIS. The RF signals of different bands are inputted via the RF input stages RFIS and outputted via the RF output stages RFOS, and finally are switched by the switch 940. Each of the LNAs 950 is a first stage element, and the switch 940 is a second stage element. According to the formula (1) of the disclosure, the noise figure of each of the LNAs is the first stage element and therefore is easier to control.

Figure 10:
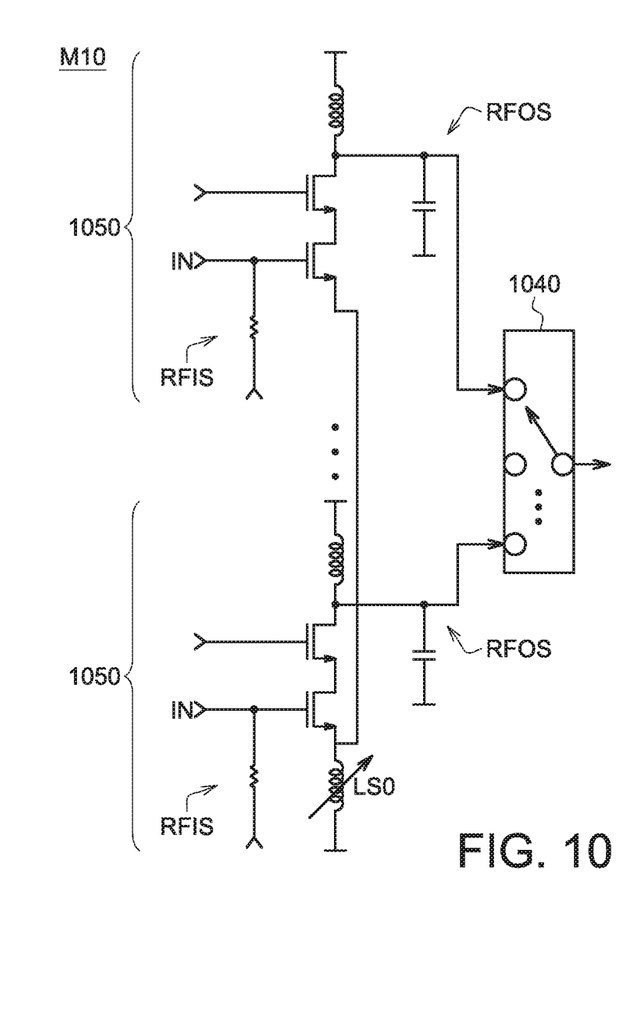
FIG. 10 shows a schematic diagram of an amplifier circuit module according to another embodiment.

Referring to FIG. 10, a schematic diagram of an amplifier circuit module M10 according to another embodiment is shown. The amplifier circuit module M10 includes a plurality of LNAs 1050 and a switch 1040. The embodiment of FIG. 10 is different from the embodiment of FIG. 9 mainly in that the RF input stages RFIS of the LNAs 1050 share an adjustable input inductor LS0. The adjustable input inductor LS0 can be adjusted to a specific inductance value according to the target RF input stage RFIS. Thus, the quantity of elements can be largely reduced to match the market trend of lightweight, slimness and compactness.

Figure 11:
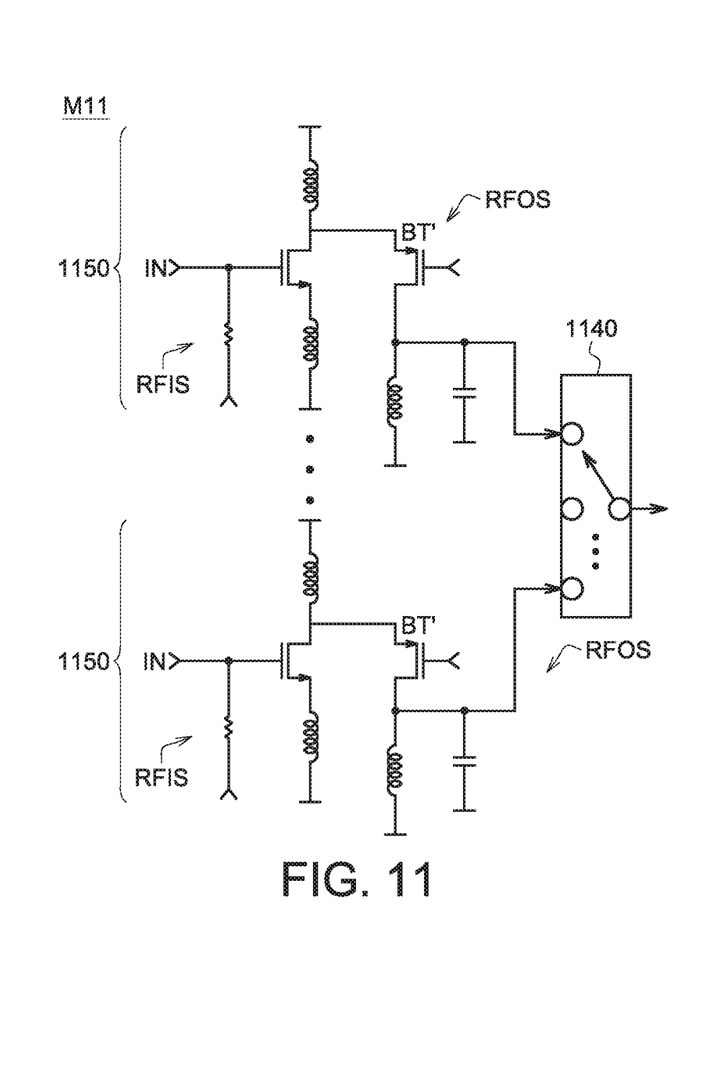
FIG. 11 shows a schematic diagram of an amplifier circuit module according to another embodiment.

Referring to FIG. 11, a schematic diagram of an amplifier circuit module M11 according to another embodiment is shown. The above function can be implemented by the folded LNA. The amplifier circuit module M11 includes a plurality of folded LNAs 1150 and a switch 1140. As indicated in FIG. 11, each of the folded LNAs 1150 includes a plurality of RF input stages RFIS, a plurality of bias transistors BT' and an RF output stage RFOS. Each of the bias transistors BT' can be realized by a P-type metal-oxide-semiconductor field-effect transistor (MOSFET). The RF output stage RFOS is connected in parallel with the RF input stages RFIS.

Figure 12:
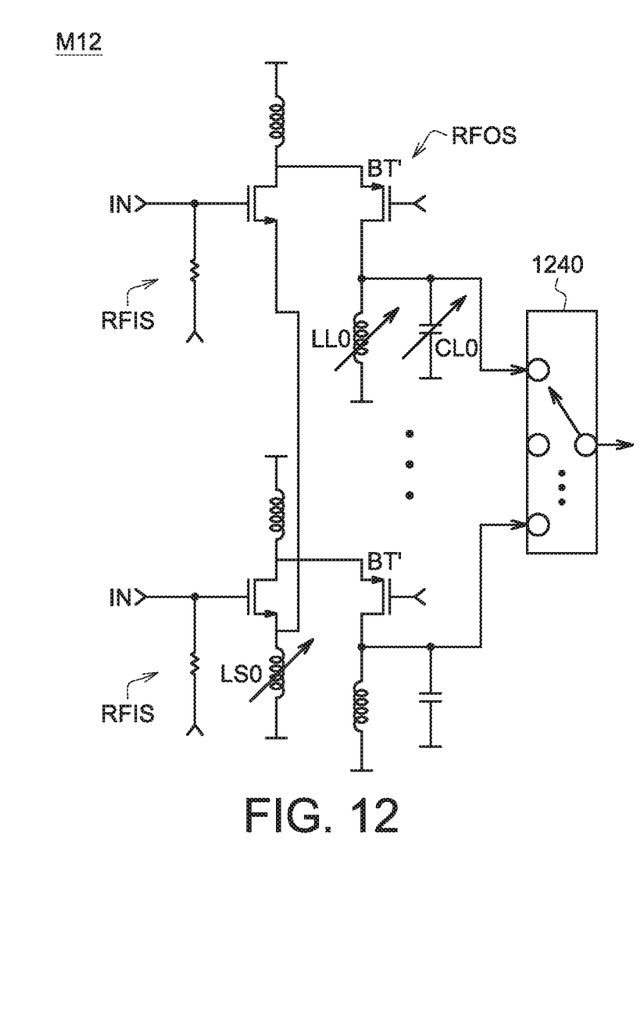
FIG. 12 shows a schematic diagram of an amplifier circuit module according to another embodiment.

Referring to FIG. 12, a schematic diagram of an amplifier circuit module M12 according to another embodiment is shown. The amplifier circuit module M12 includes a plurality of folded LNAs 1250 and a switch 1240. The embodiment of FIG. 12 is different from the embodiment of FIG. 11 mainly in that the RF input stages RFIS of the folded LNAs 1250 share an adjustable input inductor LS0. The adjustable input inductor LS0 can be adjusted to a specific inductance value according to the target RF input stage RFIS. Thus, the quantity of elements can be largely reduced to match the market trend of lightweight, slimness and compactness.

According to the embodiments disclosed above, a switch function can be implemented through the bias transistor in the LNA (or the folded LNA), the LNA (or the folded LNA) can be operated under multi bands without using any external switch. Once the external switch is omitted, the LNA (or the folded LNA) is the only one element in the link, and the noise figure of the LNA (or the folded LNA) will be easier to control. Or, the switch can be disposed following the LNA (or the folded LNA), the LNA (or the folded LNA) is the first stage element, and the switch is the second stage element. The noise figure of the LNA (or the folded LNA) which is the first stage element will also be easier to control.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A low-noise amplifier (LNA), comprising:
   a plurality of radio frequency (RF) input stages;
   at least one bias transistor connected to the RF input stages to provide a DC bias source to one of the RF input stages for isolating others of the RF input stages; and
   at least one radio frequency (RF) output stage, wherein the RF input stages are connected in parallel and connected to the RF output stage, and all of the plurality of RF input stages are directly connected to only one adjustable input inductor;
   wherein the adjustable input inductor is adjusted to according to a selection of the RF input stages.

2. The LNA according to claim 1, wherein a quantity of the at least one RF output stage is one, the RF output stage comprises an adjustable output inductor, and the RF input stages share the adjustable output inductor.

3. The LNA according to claim 2, wherein the RF output stage comprises an adjustable output capacitance, and the RF input stages share the adjustable output capacitance.

4. The LNA according to claim 1, wherein a quantity of the at least one bias transistor is one, and the RF input stages share the bias transistor.

* * * * *